(12) United States Patent
Bian et al.

(10) Patent No.: US 8,828,812 B2
(45) Date of Patent: Sep. 9, 2014

(54) SILICON-GERMANIUM HETEROJUNCTION TUNNEL FIELD EFFECT TRANSISTOR AND PREPARATION METHOD THEREOF

(71) Applicant: Shanghai Institute of Microsystem and Information Technology, Chinese Academy of Sciences, Shanghai (CN)

(72) Inventors: Jiantao Bian, Shanghai (CN); Zhongying Xue, Shanghai (CN); Zengfeng Di, Shanghai (CN); Miao Zhang, Shanghai (CN)

(73) Assignee: Shanghai Institute of Microsystem and Information Technology, Chinese Academy, Changning District, Shanghai (CN)

( * ) Notice: Subject to any disclaimer, the term of this patent is extended or adjusted under 35 U.S.C. 154(b) by 50 days.

(21) Appl. No.: 13/811,268

(22) PCT Filed: Sep. 19, 2012

(86) PCT No.: PCT/CN2012/081589
§ 371 (c)(1),
(2), (4) Date: Jan. 19, 2013

(87) PCT Pub. No.: WO2013/041019
PCT Pub. Date: Mar. 28, 2013

(65) Prior Publication Data
US 2014/0199825 A1 Jul. 17, 2014

(30) Foreign Application Priority Data
Sep. 20, 2011 (CN) .......................... 2011 1 0279693

(51) Int. Cl.
*H01L 21/338* (2006.01)

(52) U.S. Cl.
USPC .................... 438/172; 438/479; 257/E21.387

(58) Field of Classification Search
USPC ........... 438/174, 179; 257/E21.093, E21.103, 257/E21.387
See application file for complete search history.

(56) References Cited

U.S. PATENT DOCUMENTS

2011/0084319 A1* 4/2011 Zhu et al. ...................... 257/288

* cited by examiner

*Primary Examiner* — Cheung Lee
(74) *Attorney, Agent, or Firm* — Tianhua Gu; Global IP Services

(57) ABSTRACT

A silicon/germanium (SiGe) heterojunction Tunnel Field Effect Transistor (TFET) and a preparation method thereof are provided, in which a source region of a device is manufactured on a silicon germanium (SiGe) or Ge region, and a drain region of the device is manufactured in a Si region, thereby obtaining a high ON-state current while ensuring a low OFF-state current. Local Ge oxidization and concentration technique is used to implement a Silicon Germanium On Insulator (SGOI) or Germanium On Insulator (GOI) with a high Ge content in some area. In the SGOI or GOI with a high Ge content, the Ge content is controllable from 50% to 100%. In addition, the film thickness is controllable from 5 nm to 20 nm, facilitating the implementation of the device process. During the oxidization and concentration process of the SiGe or Ge and Si, a SiGe heterojunction structure with a gradient Ge content is formed between the SiGe or Ge and Si, thereby eliminating defects. The preparation method according to the present invention has a simple process, which is compatible with the CMOS process and is applicable to mass industrial production.

18 Claims, 3 Drawing Sheets

SILICON-GERMANIUM HETEROJUNCTION TUNNEL FIELD EFFECT TRANSISTOR AND PREPARATION METHOD THEREOF

CROSS REFERENCE TO RELATED PATENT APPLICATION

The present application is the US national stage of PCT/CN2012/081589 filed on Sep. 19, 2012, which claims the priority of the Chinese patent application No. 201110279693.9 filed on Sep. 20, 2011, which application is incorporated herein by reference.

BACKGROUND OF THE PRESENT INVENTION

1. Field of Invention

The present invention relates to a transistor and a preparation method thereof, and specifically to a silicon (Si)-germanium (Ge) heterojunction Tunnel Field Effect Transistor (TFET) and a preparation method thereof.

2. Description of Related Arts

In recent years, the microelectronic technology centered on silicon integrated circuits develops rapidly. The development of the integrated circuit chip follows Moore's Law, that is, the degree of integration of semiconductor chips doubles every 18 months. In the past, the advancement of the microelectronic technology is based on the continuous optimization of the cost effectiveness of materials and processes. However, with the development of the microelectronic technology, it becomes more and more difficult to reduce the size of a conventional silicon-based Complementary Metal-Oxide-Semiconductor Transistor (CMOS) proportionally. Moreover, most electronic products manufactured using Metal-Oxide-Semiconductor Field-Effect Transistors (MOSFETs) have the following problems: First, electric leakage increases as the channel of the MOSFET becomes shorter, and power keeps being consumed even in an off state or standby state. Citing a report from the European Union, IBM points out that 10% of home and office electricity is wasted for the standby state of electronic products. Secondly, restricted by the physical mechanism, a conventional MOSFET has a large sub-threshold swing.

A solution to the above problems is to use a TFET structure. Compared with a conventional MOSFET, the TFET has a different working principle that makes further reduction of the circuit size possible. The TFET has the advantages of a low leakage current, small sub-threshold swing, and low power consumption. However, the ON-state current of the silicon-based TFET is small. Although materials with a narrow band gap (such as Ge and silicon germanium (SiGe)) may improve the ON-state current, these materials increase the OFF-state current.

A SiGe heterojunction TFET increases the ON-state current while maintaining a low OFF-state current. However, the SiGe heterojunction is mainly prepared through an epitaxial technique. For SiGe film with a high Ge content, due to the limit of lattice mismatch (4.2%) between Ge and Si, when the material grows beyond a critical thickness thereof, a lot of defects are incurred, leading to greater electric leakage of devices. The devices also require a certain thickness of the film. If the film is excessively thin, a device process is difficult to implement. Therefore, a feasible method for implementing a high-quality SiGe heterojunction structure and maintaining a certain film thickness is required, so as to produce a high-performance SiGe heterojunction TFET.

SUMMARY OF THE PRESENT INVENTION

In view of the above situations and disadvantages in the prior art, the present invention is directed to a SiGe heterojunction TFET and a preparation method thereof, so as to solve the problems concerning the defects and thickness of SiGe heterojunction in the prior art, thereby implementing a high-performance TFET.

In order to accomplish the above objective and other related objectives, the present invention provides a preparation method of a SiGe heterojunction TFET. The method at least comprises the following steps: Step 1: providing a Silicon On Insulator (SOI) substrate having top Si, a buried oxide layer and a back substrate, forming a SiGe layer and a surface Si layer in sequence on the top Si, and etching off peripheral parts of the SiGe layer and the surface Si layer according to a preset size, so as to form a mesa structure stacked by the SiGe layer and the surface Si layer on a surface of the top Si; Step 2: forming a silicon dioxide ($SiO_2$) layer on the entire surface of the mesa structure, then forming a silicon nitride ($Si_3N_4$) layer on the surface of the $SiO_2$ layer, and finally etching off $Si_3N_4$ on the top of the mesa structure; Step 3: performing oxidizing and annealing on the mesa structure to oxidize the surface Si layer and gradually oxidize the SiGe layer and the top Si, so that Ge in the SiGe layer is longitudinally diffused toward the top Si and gradually concentrated, and is laterally diffused in the top Si to form a Ge/Si heterojunction structure with a gradient Ge content, so as to prepare a SiGe or Ge region; Step 4: removing the $Si_3N_4$ layer and the $SiO_2$ layer, polishing the surfaces of the top Si and the SiGe or Ge region, and then manufacturing an isolation trench at a preset position to form a SiGe or Ge region and a Si region for preparing a device; Step 5: manufacturing a gate, and manufacturing a source region and a drain region using a self-aligned process, in which the source region is located in the SiGe or Ge region, the drain region is located in the Si region, and the gate comprises a part of the SiGe or Ge region and a part of the Si region.

In the preparation method according to the present invention, preferably, chemical vapor deposition is used to manufacture the SiGe layer and the surface Si layer.

In the preparation method according to the present invention, the thickness of the top Si is 20 nm to 30 nm, and the thickness of the surface Si layer is 20 nm to 30 nm.

In the preparation method according to the present invention, the thickness of the SiGe layer is 20 nm to 50 nm.

In the preparation method according to the present invention, the Ge content of the SiGe layer is 10% to 25%.

In the preparation method according to the present invention, in Step 3, oxidizing is performed in an oxygen ($O_2$) atmosphere and annealing is performed in a nitrogen ($N_2$) atmosphere.

In the preparation method according to the present invention, in Step 3, the mesa structure layer is treated with a first stage of oxidizing and annealing until the Ge content gets 50% in the top Si, and then treated with a second stage of oxidizing and annealing.

In the preparation method according to the present invention, oxidizing and annealing are performed several times at 1005° C. to 1100° C. in the first stage of oxidizing and annealing, and each time of oxidizing and annealing lasts for 0.5 hour to 1 hour; oxidizing and annealing are performed several times at 900° C. to 950° C. in the second stage of oxidizing and annealing, and each time of oxidizing and annealing lasts for 0.5 hour to 1 hour.

In the preparation method according to the present invention, in Step 4, the $Si_3N_4$ layer is removed through thermal phosphoric acid etching, the $SiO_2$ layer is removed through hydrogen fluoride (HF) etching, and polishing is performed using a chemical-mechanical method.

In the preparation method according to the present invention, Step 5 further comprises the step of manufacturing a spacer structure at the periphery of the gate.

In addition, the present invention also provides a SiGe heterojunction TFET that at least comprises: an SOI substrate having top Si, a buried oxide layer and a back substrate; a gate, disposed on the upper surface of the top Si; an active region, located below an electrode of the gate and formed in the top Si, in which the active region comprises a SiGe or Ge region having a source region and a Si region having a drain region, and a Ge/Si heterojunction structure with a gradient Ge content is formed at the junction between the SiGe or Ge region and the Si region; and an isolation trench, located at the periphery of the active region to isolate the active region.

In the transistor according to the present invention, the gate comprises a gate insulating layer located on the top Si, a gate electrode located on the gate insulating layer and a spacer structure at peripheries of the gate insulating layer and the gate electrode.

In the transistor according to the present invention, the source region is a P-type doped region, and the drain region is an N-type doped region.

In the transistor according to the present invention, the source region is an N-type doped region, and the drain region is a P-type doped region.

In the above two transistors, doping elements in the P-type doped region are boron (B) or boron difluoride ($BF_2$); doping elements in the N-type doped region are phosphorus (P), arsenic (As), or antimony (Sb).

In the transistor according to the present invention, a Ge content of the SiGe or Ge region is 50% to 100%.

In the transistor according to the present invention, the thickness of the SiGe or Ge region is 5 nm to 20 nm.

As described above, the present invention implements a planar SiGe heterojunction TFET, in which the source region of the device is manufactured in the SiGe (or Ge) region, and the drain region of the device is manufactured in the Si region, thereby obtaining a high ON-state current while ensuring a low OFF-state current. Local Ge oxidization and concentration technique is used to implement a Silicon Germanium On Insulator (SGOI) or Germanium On Insulator (GOI) with a high Ge content in some area. In the SGOI or GOI with a high Ge content, the Ge content is controllable from 50% to 100%. In addition, the film thickness is controllable from 5 nm to 20 nm, facilitating the implementation of the device process. During the oxidization and concentration process of the SiGe (or Ge) and Si, a SiGe heterojunction structure with a gradient Ge content is formed between the SiGe (or Ge) and Si, thereby eliminating the defects. The preparation method according to the present invention has a simple process, which is compatible with the CMOS process and is applicable to mass industrial production.

DETAILED DESCRIPTION OF THE PREFERRED EMBODIMENTS

Figure 1A:
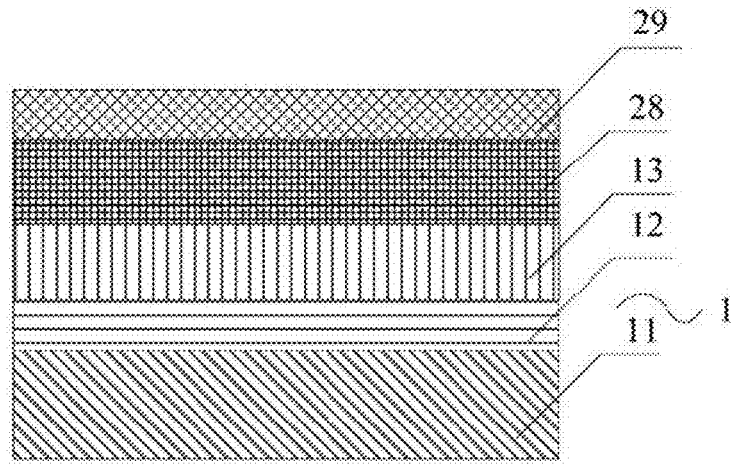
FIG. 1a to FIG. 5 are schematic structural views of steps in a preparation method according to the present invention.

The implementation manner of the present invention is described in detail below through specific embodiments. Persons skilled in the art can easily learn other advantages and efficacies of the present invention according to the disclosure of the specification. The present invention can also be implemented or applied through other embodiments. Based on different perspectives and applications, modifications or alterations without departing from the spirit of the present invention can be made to the details in the specification.

It should be noted that, the drawings provided in the embodiment is merely an example for illustrating the basic ideas of the present invention. Therefore, only the components related to the present invention are shown in the drawings, and the drawings are not based on the number, shapes and sizes of components in practical implementations. The forms, number and proportion of the components in practical implementations may be changed randomly, and the distribution of the components may be more complex.

Figure 1B:
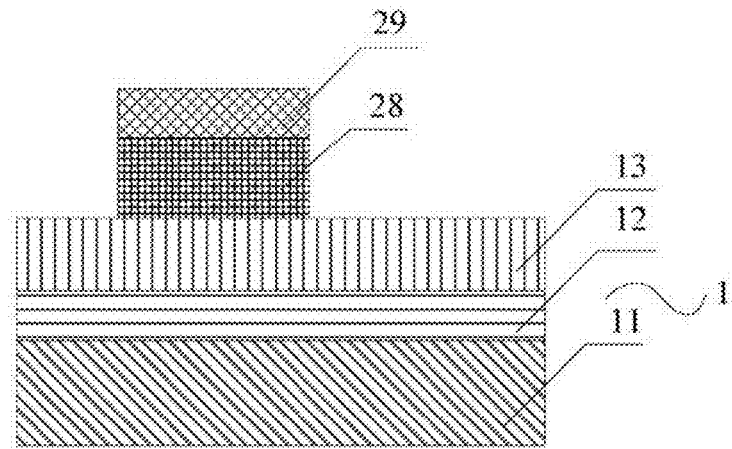

As shown in FIG. 1a to FIG. 5, the present invention provides a preparation method of a SiGe heterojunction TFET, which at least includes the following steps:

Referring to FIG. 1a and FIG. 1b, Step 1 is performed first, in which an SOI substrate 1 having top Si 13, a buried oxide layer 12, and a back substrate 11 is provided. Specifically, an SOI substrate 1 having top Si, a $SiO_2$ buried oxide layer and a Si substrate may be provided. A SiGe layer 28 and a surface Si layer 29 are grown on the top Si in sequence through chemical vapor deposition. Of course, the SiGe layer 28 and the surface Si layer 29 may also be formed in sequence through molecular beam epitaxy. Peripheral parts of the SiGe layer 28 and the surface Si layer 29 are etched off according to a preset size. Specifically, the peripheral parts of the SiGe layer 28 and the surface Si layer 29 are etched off through dry or wet etching, so as to form a mesa structure stacked by the SiGe layer 28 and the surface Si layer 29 on the surface of the top Si.

In a preferred solution in the embodiment of the present invention, the thickness of the top Si 13 is 20 nm to 30 nm. The thickness of the surface Si layer 29 is 20 nm to 30 nm. The thickness of the SiGe layer 28 is 20 nm to 50 nm. A Ge content of the SiGe layer 28 is 10% to 25%.

Figure 2:
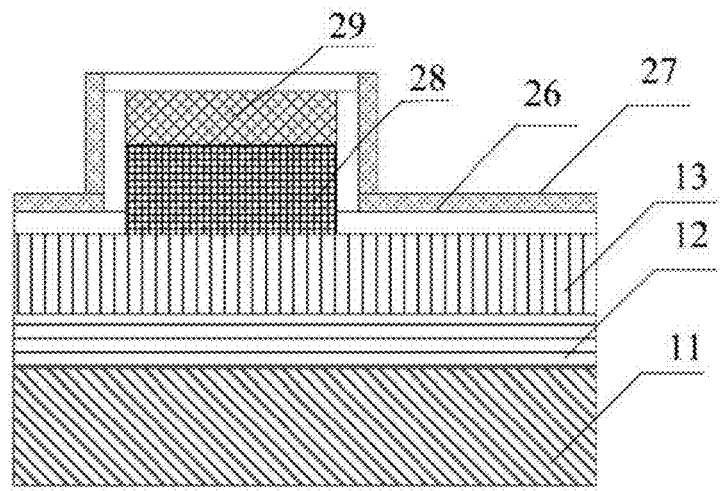

Referring to FIG. 2, Step 2 is then performed, in which a $SiO_2$ layer 26 is formed on the entire surface of the mesa structure, and then a $Si_3N_4$ layer 27 is formed on the surface of the $SiO_2$ layer 26. In the specific implementation, the $SiO_2$ layer 26 is formed through oxidization or chemical vapor deposition, and the $Si_3N_4$ layer 27 is formed through chemical vapor deposition. Finally, $Si_3N_4$ on the top of the mesa structure is etched off.

Figure 3:
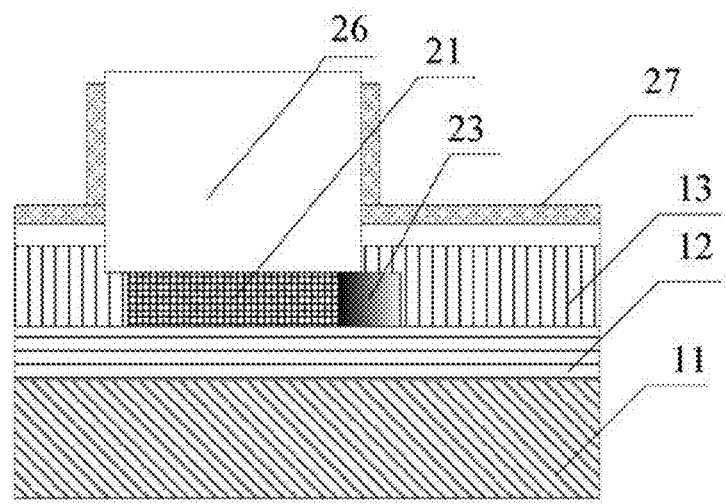

Referring to FIG. 3, Step 3 is then performed, in which oxidizing and annealing are performed on the mesa structure to oxidize the surface Si layer 29 and gradually oxidize the SiGe layer 28 and the top Si 13, so that Ge in the SiGe layer 28 is longitudinally diffused toward the top Si 13 and gradually concentrated, and is laterally diffused in the top Si 13 to form a Ge/Si heterojunction structure 23 with a gradient Ge content, so as to prepare a SiGe or Ge region 21.

A preferred solution of the embodiment is described as follows. The mesa structure is put in an oxygen ($O_2$) atmosphere and a nitrogen ($N_2$) atmosphere for a first stage of oxidizing and annealing. Specifically, oxidizing and annealing are performed several times at 1105° C. to 1100° C., and each time of oxidizing and annealing lasts for 0.5 hour to 1 hour, until the Ge content gets 50% in the top Si 13. Then a second stage of oxidizing and annealing is performed, in which oxidizing and annealing are performed several times at 900° C. to 950° C., and each time of oxidizing and annealing lasts for 0.5 hour to 1 hour, so that the content of Ge gradually increases in the top Si 13. Ge and the top Si 13 are laterally diffused with each other, to form a Ge/Si heterojunction structure 23 with a gradient Ge content. Specifically, in the oxidizing and annealing process, the surface Si layer 26 is gradually oxidized to be $SiO_2$, and Si in the SiGe layer 28 is also gradually oxidized to be $SiO_2$. Therefore, the content of Ge gradually increases as the SiGe layer 28 is oxidized, and Ge is longitudinally diffused to the top Si 13. Meanwhile, the top Si 13 is diffused toward the SiGe layer 28 and is gradually oxidized, which also causes the content of Ge in the top Si 13 to increase, and the Ge is diffused laterally, thereby forming the Ge/Si heterojunction structure 23 with a gradient Ge content.

Figure 4A:
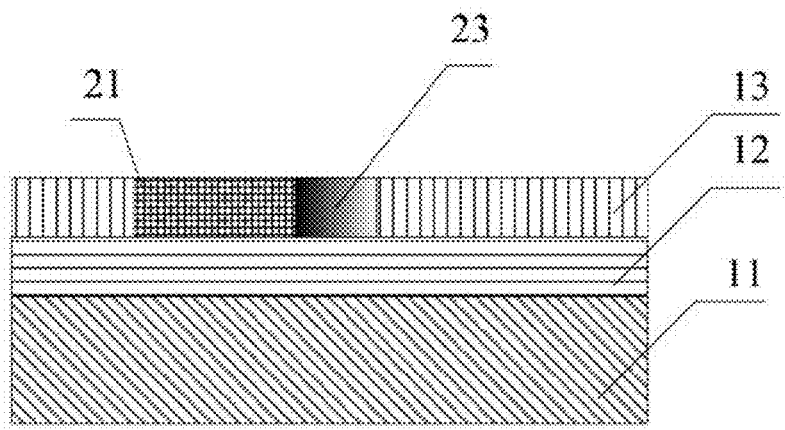
Figure 4B:
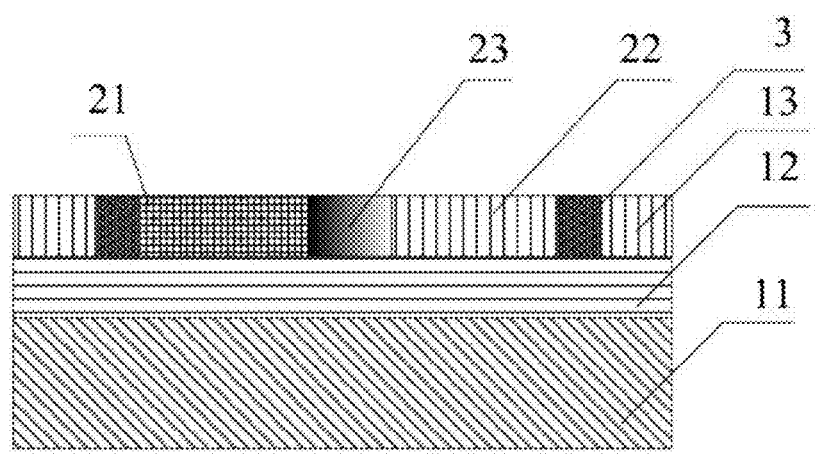

Referring to FIG. 4a and FIG. 4b, Step 4 is performed, in which the $Si_3N_4$ layer 27 and the $SiO_2$ layer 26 are removed, the surfaces of the top Si 13 and SiGe or Ge region 21 are polished, and an isolation trench 3 is manufactured at a preset position, so as to form the SiGe or Ge region 21 and a Si region 22 that are used as an active region of a device.

During the specific implementation, the $Si_3N_4$ layer 27 is removed through thermal phosphoric acid etching, the $SiO_2$ layer 26 is removed through HF etching. Of course, the $Si_3N_4$ layer 27 and the $SiO_2$ layer 26 may also be etched through reactive ion etching. The surfaces of the top Si 13 and the SiGe or Ge region 21 are polished using a chemical-mechanical method.

It should be noted that, the isolation trench 3 preferably uses a shallow trench isolation (STI) process. The STI isolation trench is prepared as follows: two trenches are etched through dry or wet etching in the top Si 13, and $SiO_2$ is then deposited in the trenches through chemical vapor deposition or other methods, and is used as a filling medium for isolation.

In Step 5, a gate 4 is manufactured; a source region 24 and a drain region 25 are manufactured using a self-aligned process, in which the source region 24 is located in the SiGe or Ge region 21, the drain region 25 is located in the Si region 22, and the gate 4 covers both a part of the SiGe or Ge region 21 and a part of the Si region 22.

The specific implementation is described as follows: a gate insulating layer 41 and a gate electrode layer 42 are formed on the surfaces of the top Si 13, SiGe or Ge region 21, Si region 22 and isolation trench 3. The gate 4 is prepared through etching according to the preset position and size of the preset gate 4, and a spacer structure 43 is manufactured at the periphery of the gate 4, in which the spacer structure 43 may be $SiO_2$ and $Si_3N_4$. Ions are injected into the source region 24 and drain region 25 using the self-aligned process. In a preferred solution, P-type doping using B or $BF_2$ is performed on the source region 24; N-type doping using P, As or Sb is performed on the drain region 25. Of course, N-type doping using P, As or Sb may be performed on the source region 24, and P-type doping using B or $BF_2$ may be performed on the drain region 25. Finally, contact electrodes of the source region, drain region and gate are manufactured, thereby completing the preparation of the SiGe heterojunction TFET.

Figure 5:
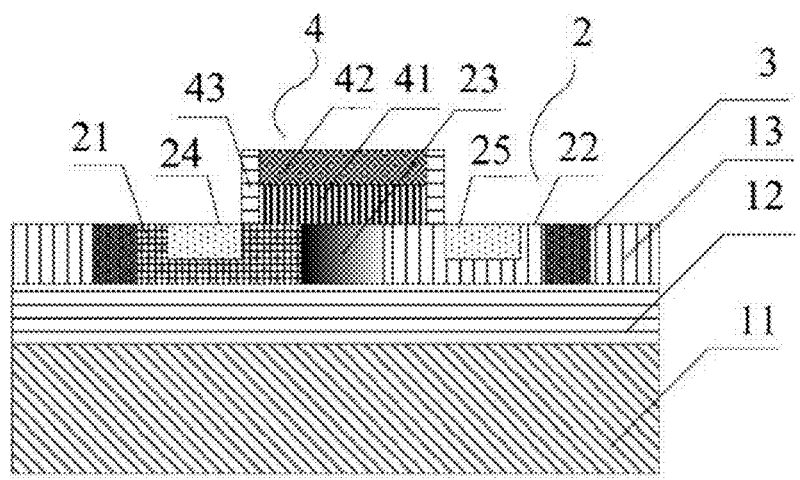

As shown in FIG. 5, the present invention further provides a SiGe heterojunction TFET. The transistor at least includes an SOI substrate 1 having top Si 11, a buried oxide layer 12, and a back substrate 13, in which the material of the buried oxide layer is $SiO_2$, and the material of the back substrate is Si; a gate 4, disposed on upper surfaces of the top Si 13 and SiGe or Ge region 21, in which specifically the gate includes a gate insulating layer 41 located on the top Si 13 and SiGe or Ge region 21, a gate electrode 42 located on the gate insulating layer 41, and a spacer structure 43 disposed at the peripheries of the gate insulating layer 41 and the gate metal electrode 42, the gate insulating layer 41 is a $SiO_2$ layer or an H-K insulating medium layer such as hafnium dioxide ($HfO_2$), aluminum oxide ($Al_2O_3$), silicon oxynitride (SiON), and so on, the material of the gate electrode 42 may be nickel silicide (NiSi), tantalum nitride (TaN), titanium nitride (TiN), and so on, the spacer structure 43 is a $SiO_2$ layer or a $Si_3N_4$ layer; an active region 2, located below the gate 4 and formed in the top Si 13, in which the active region 2 includes the SiGe or Ge region 21 having a source region 24 and the Si region 22 having the drain region 25, and a Ge/Si heterojunction structure 23 with a gradient Ge content is formed at the junction between the SiGe or Ge region 21 and the Si region 22; and an isolation trench 3, located at the periphery of the active region 2 to isolate the active region, so as to implement the isolation among devices. Optimally, the isolation trench 3 is an STI isolation trench, and $SiO_2$ is used as a filling medium for isolation of the STI.

In the embodiment of the present invention, in one implementation manner, the source region 24 is a P-type doped region, and the source region 25 is an N-type doped region. In another implementation manner, the source region 24 is an N-type doped region, and the source region 25 is a P-type doped region. For the two implementation manners, it should be noted that, the doping elements in the P-type doped region are B or $BF_2$; the doping elements in the N-type doped region are P, As or Sb, in which the N-type and P-type doping are implemented through ion implantation and rapid thermal annealing or laser annealing.

In a preferred solution of the embodiment, the content of Ge in the SiGe or Ge region 21 is 50% to 100%, and the thickness of the SiGe or Ge region is 5 nm to 20 nm.

In summary, the present invention implements a planar SiGe heterojunction TFET, in which the source region of the device is manufactured in the SiGe or Ge region, and the drain region of the device is manufactured in the Si region, thereby obtaining a high ON-state current while ensuring a low OFF-state current. Local Ge oxidization and concentration technique is used to implement SGOI or GOI with a high Ge content in some part. In the SGOI or GOI with a high Ge content in some area, the Ge content is controllable from 50% to 100%. In addition, the film thickness is controllable from 5 nm to 20 nm, facilitating the implementation of the device process. During the oxidization and concentration process of the SiGe (or Ge) and Si, a SiGe heterojunction structure with a gradient Ge content is formed between the SiGe (or Ge) and Si, thereby eliminating defects. The preparation method according to the present invention has a simple process, which is compatible with the CMOS process and is applicable to mass industrial production. The present invention eliminates the disadvantages in the prior art and therefore has a high industrial value.

The above embodiments are examples for illustrating principles and efficacies of the present invention, and are not intended to limit the present invention. Within the spirit and scope of the present invention, persons skilled in the art may make modifications or variations to the above embodiments. Accordingly, all modifications or variations completed by those with ordinary skill in the art should fall within the scope of the present invention defined by the appended claims.

What is claimed is:

1. A preparation method of a silicon (Si)/germanium (Ge) heterojunction Tunnel Field Effect Transistor (TFET) comprising steps of:

Step 1: providing a Silicon On Insulator (SOI) substrate having top Si, a buried oxide layer and a back substrate, forming a silicon germanium (SiGe) layer and a surface Si layer successively on the top Si, and etching off peripheral parts of the SiGe layer and the surface Si layer according to a preset size, so as to form a mesa structure stacked by the SiGe layer and the surface Si layer on the surface of the top Si;

Step 2: forming a $SiO_2$ layer on the entire surface of the mesa structure, then forming a silicon nitride ($Si_3N_4$)

layer on the surface of the silicon dioxide (SiO$_2$) layer, and finally etching off Si$_3$N$_4$ on the top of the mesa structure;

Step 3: performing oxidizing and annealing on the mesa structure to oxidize the surface Si layer and gradually oxidize the SiGe layer and the top Si, so that Ge in the SiGe layer is longitudinally diffused toward the top Si and gradually concentrated, and is laterally diffused in the top Si to form a Ge/Si heterojunction structure with a gradient Ge content, so as to prepare a SiGe or Ge region;

Step 4: removing the Si$_3$N$_4$ layer and the SiO$_2$ layer, polishing the surfaces of the top Si and the SiGe or Ge region, and then manufacturing an isolation trench at a preset position to form a SiGe or Ge region and a Si region for preparing a device; and Step 5: manufacturing a gate, and manufacturing a source region and a drain region using a self-aligned process, wherein the source region is located in the SiGe or Ge region, the drain region is located in the Si region, and the gate covers both a part of the SiGe or Ge region and a part of the Si region.

2. The preparation method of a SiGe heterojunction TFET as in claim 1, wherein the SiGe layer and the surface Si layer are grown through chemical vapor deposition in an epitaxial manner.

3. The preparation method of a SiGe heterojunction TFET as in claim 1, wherein the thickness of the top Si is 20 nm to 30 nm, and the thickness of the surface Si layer is 20 nm to 30 nm.

4. The preparation method of a SiGe heterojunction TFET as in claim 1, wherein the thickness of the SiGe layer is 20 nm to 50 nm.

5. The preparation method of a SiGe heterojunction TFET as in claim 1, wherein a Ge content of the SiGe layer is 10% to 25%.

6. The preparation method of a SiGe heterojunction TFET as in claim 1, wherein oxidizing is performed in an oxygen (O$_2$) atmosphere and annealing is performed in a nitrogen (N$_2$) atmosphere in Step 3.

7. The preparation method of a SiGe heterojunction TFET as in claim 1, wherein in Step 3, the mesa structure layer is first treated with a first stage of oxidizing and annealing until a Ge content gets 50% in the top Si, and the mesa structure layer is then treated with a second stage of oxidizing and annealing.

8. The preparation method of a SiGe heterojunction TFET as in claim 7, wherein oxidizing and annealing are performed several times at 1005° C. to 1100° C. in the first stage of oxidizing and annealing, and each time of oxidizing and annealing lasts for 0.5 hour to 1 hour; oxidizing and annealing are performed several times at 900° C. to 950° C. in the second stage of oxidizing and annealing, and each time of oxidizing and annealing lasts for 0.5 hour to 1 hour.

9. The preparation method of a SiGe heterojunction TFET as in claim 1, wherein in Step 4, the Si$_3$N$_4$ layer is removed through thermal phosphoric acid etching, the SiO$_2$ layer is removed through hydrogen fluoride (HF) etching, and polishing is performed using a chemical-mechanical method.

10. The preparation method of a SiGe heterojunction TFET as in claim 1, wherein Step 5 further comprises the step of manufacturing a spacer structure at the periphery of the gate.

11. A silicon (Si)/germanium (Ge) heterojunction Tunnel Field Effect Transistor (TFET), at least comprising:
a Silicon On Insulator (SOI) substrate having top Si, a buried oxide layer and a back substrate; a gate, disposed on the upper surface of the top Si; an active region, located below an electrode of the gate and formed in the top Si, wherein the active region comprises a silicon germanium (SiGe) or Ge region having a source region and a Si region having a drain region, and a Ge/Si heterojunction structure with a gradient Ge content is formed at the junction between the SiGe or Ge region and the Si region; and an isolation trench, located at the periphery of the active region to isolate the active region.

12. The SiGe heterojunction TFET as in claim 11, wherein the gate comprises a gate insulating layer located on the top Si, a gate electrode located on the gate insulating layer, and a spacer structure disposed at the peripheries of the gate insulating layer and the gate electrode.

13. The SiGe heterojunction TFET as in claim 11, wherein the source region is a P-type doped region, and the drain region is an N-type doped region.

14. The SiGe heterojunction TFET as in claim 13, wherein doping elements in the P-type doped region are boron (B) or boron difluoride (BF$_2$); doping elements in the N-type doped region are phosphorus (P), arsenic (As), or antimony (Sb).

15. The SiGe heterojunction TFET as in claim 11, wherein the source region is an N-type doped region, and the drain region is a P-type doped region.

16. The SiGe heterojunction TFET as in claim 15, wherein doping elements in the P-type doped region are boron (B) or boron difluoride (BF$_2$); doping elements in the N-type doped region are phosphorus (P), arsenic (As), or antimony (Sb).

17. The SiGe heterojunction TFET as in claim 11, wherein a Ge content of the SiGe or Ge region is 50% to 100%.

18. The SiGe heterojunction TFET as in claim 11, wherein the thickness of the SiGe or Ge region is 5 nm to 20 nm.

* * * * *